United States Patent
Ren et al.

(10) Patent No.: US 11,171,610 B2
(45) Date of Patent: Nov. 9, 2021

(54) TRANSFORMER-BASED DOHERTY POWER AMPLIFIER

(71) Applicant: Shanghai Huahong Grace Semiconductor Manufacturing Corporation, Shanghai (CN)

(72) Inventors: Jiangchuan Ren, Shanghai (CN); Ruofan Dai, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 36 days.

(21) Appl. No.: 16/731,691

(22) Filed: Dec. 31, 2019

(65) Prior Publication Data

US 2020/0274495 A1 Aug. 27, 2020

(30) Foreign Application Priority Data

Feb. 27, 2019 (CN) .......................... 201910144386.6

(51) Int. Cl.
*H03F 1/02* (2006.01)
*H03F 3/21* (2006.01)

(52) U.S. Cl.
CPC ........... *H03F 1/0288* (2013.01); *H03F 3/211* (2013.01); *H03F 2200/534* (2013.01); *H03F 2200/541* (2013.01)

(58) Field of Classification Search
CPC .. H03F 1/0288; H03F 3/211; H03F 2200/534; H03F 2200/541
USPC ......................................................... 330/295
See application file for complete search history.

(56) References Cited

U.S. PATENT DOCUMENTS

2018/0241352 A1* 8/2018 Wang ..................... H03F 1/38

FOREIGN PATENT DOCUMENTS

| CN | 109889163 A | * | 6/2019 |
| CN | 111313849 A | * | 6/2020 |

OTHER PUBLICATIONS

Kaymaksüt et al., A 2.4 GHz Fully Integrated Doherty Power Amplifier Using Series Combining Transformer, 2010 Proceedings of ESSCIRC, IEEE. (Year: 2010).*

(Continued)

*Primary Examiner* — Hafizur Rahman
(74) *Attorney, Agent, or Firm* — Murtha Cullina LLP

(57) ABSTRACT

A transformer-based Doherty power amplifier includes a main power amplifier path and an auxiliary power amplifier path which are connected in parallel. The main power amplifier path includes a main power amplifier, and the auxiliary power amplifier path includes an auxiliary power amplifier. The transformer-based Doherty power amplifier further includes a first linear network circuit or a second linear network circuit. The first linear network circuit is arranged at an input of the main power amplifier and is used to compensate for variations of an input capacitance of the main power amplifier, so as to improve the linearity of the main power amplifier. The second linear network circuit is arranged at an input of the auxiliary power amplifier and is used to compensate for variations of an input capacitance of the auxiliary power amplifier, so as to improve the linearity of the auxiliary power amplifier.

11 Claims, 6 Drawing Sheets

(56) References Cited

OTHER PUBLICATIONS

Chowdhury et al., "A Fully Integrated Dual-Mode Highly Linear 2.4 GHz CMOS Power Amplifier for 4G WiMax Applications", IEEE Journal of Solid-State Circuits, vol. 44, No. 12, Dec. 2009. (Year: 2009).*

Wang et al. "A Capacitance-Compensation Technique for Improved Linearity in CMOS Class-AB Power Amplifiers", IEEE Journal of Solid-State Circuits, vol. 39, No. 11, Nov. 2004. (Year: 2004).*

* cited by examiner

TRANSFORMER-BASED DOHERTY POWER AMPLIFIER

CROSS REFERENCE TO RELATED APPLICATION

This application claims the priority of Chinese patent application number 201910144386.6, filed on Feb. 27, 2019, the entire contents of which are incorporated herein by reference.

BACKGROUND OF THE INVENTION

The invention relates to a semiconductor integrated circuit, in particular to a transformer-based Doherty power amplifier (PA).

DESCRIPTION OF RELATED ART

Nowadays, orthogonal frequency division multiplexing (OFDM) modulation has been adopted by advanced wireless standards to increase the data rate. However, by adoption of such modulation method, the instantaneous power may be increased due to superposition of waves having identical initial phases when multiple waves are multiplexed, which results in a large peak-to-average power ratio (PAPR), the large PAPR in turn expands the dynamic range of the PAs, and consequentially, the linearity of the PAs becomes poor. In order to reduce the impact of PAPR on the nonlinearity of the PAs, power back-off is usually used for setting. As for the power back-off method, the input power of the PAs is backed off by 6-10 dB from a 1 dB compression point, wherein the 1 dB compression point is equivalent to a critical point between a linear region and a nonlinear region of the PAs; and after the input power is backed off, PAs work in the linear region, that is away from a saturation region, at a level much lower than the 1 dB compression point, so that the three-order cross modulation coefficient of the PAs is improved. However, after the input power is backed off, the efficiency of the PAs in the power back-off region is very low, and thus, the average efficiency of the PAs is reduced.

In the prior art, Doherty PAs can improve, to a certain extent, the efficiency in the power back-off region, thereby being able to improve the average efficiency. The Doherty PAs adopt an active load modulation technique to dynamically change the output impedance of a main PA and an auxiliary PA along with variations of the input power.

FIG. 1 is a structural view of an existing Doherty PA. As shown in FIG. 1, the existing Doherty PA comprises a main (Main) PA 101 and an auxiliary (Aux.) PA 102.

The main PA 101 works in class AB, and the auxiliary PA 102 works in class C. The auxiliary PA 102 is in a normally-off state before the main PA 101 is saturated, and in this case, only the main PA 101 works. When the main PA 101 is saturated, the auxiliary PA 102 is turned on, and in this case, a signal superposition of an output signal of the main PA 101 and an output signal of the auxiliary PA 102 is output.

A radio-frequency input signal RFIN is input to an input of the main PA 101, a ¼ wavelength line (λ/4 line) 103*a* is connected to an output of the main PA 101, and then a radio-frequency output signal RFOUT is output, wherein the ¼ wavelength line 103*a* is used to fulfill impedance transformations of different signal intensities.

A ¼ wavelength line 103*b* is connected to an input of the auxiliary PA 102 and is used to fulfill phase matching of a main PA 101 path and an auxiliary PA 102 path.

FIG. 2 shows input power and output power curves of the structure in FIG. 1, wherein the X-axis refers to normalized input power, the Y-axis refers to normalized output power, curve 201 is an input power and output power curve of the main PA 101, curve 202 is an input power and output power of the auxiliary PA 102, curve 203 is an input power and output power curve of the whole Doherty PA, and curve 203 is the superposition of curve 201 and curve 202. As can be seen from FIG. 2, curve 201 will be saturated with the increase of the input power and has a poor linearity, while curve 203 formed by superposition of curve 201 and curve 202 has a good linearity.

FIG. 3 shows voltage and impedance curves of the main PA 101 and the auxiliary PA 102 of the structure in FIG. 1 as well as an efficiency curve of the whole Doherty PA, wherein curve 204 is about the output voltage (Vmain) of the main PA 101 and the normalized output voltage of the Doherty PA, curve 205 is about the output voltage (Vaux.) of the auxiliary PA 102 and the normalized output voltage of the Doherty PA, curve 206 is about the impedance (Zmain) of the output of the main PA101 and the normalized output voltage of the Doherty PA, and curve 207 is about the impedance (Zaux.) of the output of the auxiliary PA 102 and the normalized output voltage of the Doherty PA.

Curve 208 is about the normalized efficiency and normalized output voltage of the Doherty PA.

The X-axis in curves 204, 205, 206, 207 and 208 refers to the normalized output voltage of the Doherty PA. The Y-axis in curves 204, 205, 206 and 207 refers to the normalized voltage and impedance on the right. The Y-axis in curve 208 refers to the normalized efficiency on the right.

As can be seen from curve 204, when the input voltage is smaller than half of the maximum input voltage, the corresponding normalized output voltage is between 0.0 and 0.5, and in this case, only the main PA 101 works. When the input voltage is right half of the maximum input voltage, the main PA 101 enters into the saturated output state, and the maximum efficiency is achieved at this moment, corresponding to the vertex of curve 208. Meanwhile, when the input voltage is smaller than half of the maximum input voltage, the corresponding impedance Zmain in curve 206 is maximized.

As can be seen from curve 203, with the continuous increase of the input voltage, the corresponding normalized output voltage falls between 0.5 and 1.0, and the auxiliary PA 102 starts to work. After working, the auxiliary PA 102 starts to actively regulate the impedance Zmain, and as shown in curve 206, the impedance Zmain is decreased. Similarly, the main PA 101 also actively regulates the impedance Zaux. of the auxiliary PA 102, and as shown in curve 207, the impedance Zaux. is also decreased. Under the condition that Vmain is kept unchanged while Zmain is decreased, the output power of the main PA 101 will be increased.

When the normalized output voltage is between 0.5 and 1.0, the efficiency will always be kept high. When the input voltage reaches the maximum value, the normalized output voltage is 1.0, and the efficiency is maximized, as shown in curve 208.

Therefore, the Doherty PA improves the efficiency in the power back-off region, as shown in curve 208.

FIG. 4 shows comparison curves of the existing Doherty PA capable of improving the efficiency in the power back-off region, wherein curve 209 is about the efficiency and output power back-off of an existing ideal Doherty PA with 6 dB back-off, and the existing ideal Doherty PA with 6 dB back-off corresponds to Ideal Doherty with 6 dB Back-off in FIG. 4; curve 210 is about the efficiency and output power back-off of an existing ideal Class-B PA, and the existing ideal Class-B PA corresponds to Ideal Class-B in FIG. 4.

Curve 211 is a probability density curve of long term evolution (LTE), and curve 212 is a probability density curve of IEEE 802.11b.

The X-axis in curves 209, 210, 211 and 212 refers to output power back-off, the Y-axis in curves 209 and 210 refers to normalized efficiency on the right, and the Y-axis in curves 211 and 212 refers to normalized probability density on the left.

As can be seen from curve 209 and 210, curve 209 is obtained by a left shift of 6 dB (6 dB back-off) on the basis of curve 210, and after the main PA is saturated, the efficiency will always be kept high. Therefore, the Doherty PA can improve the efficiency.

As can be seen from curve 211 and curve 212, systems corresponding to LTE and IEEE802.11b mainly work in the power back-off region having the efficiency being improved by the Doherty PA, and thus, average efficiency is improved.

Transformer-based Doherty PAs have been developed in recent years, and the working mode of such PAs is similar to that of the classic Doherty PA shown in FIG. 1. In spite of the high efficiency in the 6 dB power back-off region, these Doherty PAs have a poor linearity in the saturated output power region and the power back-off region and thus need to be optimized.

BRIEF SUMMARY OF THE INVENTION

The technical issue to be settled by the invention is to provide a transformer-based Doherty PA capable of improving the linearity of circuits.

To settle the above technical issue, the invention provides a transformer-based Doherty PA. The transformer-based Doherty PA comprises a main PA path and an auxiliary PA path, wherein the main PA path and the auxiliary PA path are connected in parallel.

The main PA path comprises a main PA, and the auxiliary PA path comprises an auxiliary PA.

The Doherty PA further comprises a first linear network circuit or a second linear network circuit.

The first linear network circuit is arranged at an input of the main PA and is used to compensate for variations of an input capacitance of the main PA, so as to improve the linearity of the main PA and accordingly improve the linearity of the Doherty PA.

The second linear network circuit is arranged at an input of the auxiliary PA and is used to compensate for variations of an input capacitance of the auxiliary PA, so as to improve the linearity of the auxiliary PA and accordingly improve the linearity of the Doherty PA.

Furthermore, the main PA path further comprises a main driver amplifier, wherein an output of the main driver amplifier is connected to the input of the main PA, a radio-frequency input signal is accessed to an input of the main driver amplifier, and an output of the main PA outputs a radio-frequency output signal.

Furthermore, the auxiliary PA path further comprises an auxiliary driver amplifier, wherein an output of the auxiliary driver amplifier is connected to the input of the auxiliary PA, the radio-frequency input signal is accessed to an input of the auxiliary driver amplifier, and an output of the auxiliary PA outputs the radio-frequency output signal.

Furthermore, the main PA works in class AB, and the auxiliary PA works in class C.

Furthermore, the radio-frequency input signal is accessed to the input of the main driver amplifier via a first transformer.

Furthermore, the output of the main PA outputs the radio-frequency output signal via a second transformer.

Furthermore, the output of the auxiliary PA outputs the radio-frequency output signal via a third transformer.

Furthermore, the main PA is a cascode amplifier formed by connection of two NMOS transistors, the first linear network circuit is formed by PMOS transistors connected via a capacitor, and a gate capacitance of the NMOS transistors at the input of the main PA and a gate capacitance of the PMOS transistors of the first linear network circuit are mutually compensated to stabilize the input capacitance of the main PA.

Furthermore, the auxiliary PA is a cascode amplifier formed by connection of two NMOS transistors, the second linear network circuit is formed by PMOS transistors connected via a capacitor, and a gate capacitance of the NMOS transistors at the input of the auxiliary PA and a gate capacitance of the PMOS transistors of the second linear network circuit are mutually compensated to stabilize the input capacitance of the auxiliary PA.

Furthermore, the radio-frequency input signal is a differential signal.

Furthermore, the main PA is a differential structure formed by connection of two symmetrical cascode amplifiers, the first linear network circuit comprises two PMOS transistors, and each PMOS transistor of the first linear network circuit corresponds to the NMOS transistor at the input of one cascode amplifier of the main PA.

The auxiliary PA is a differential structure formed by connection of two symmetrical cascode amplifiers, the second linear network circuit comprises two PMOS transistors, and each PMOS transistor of the second linear network circuit corresponds to the NMOS transistor at the input of one cascode amplifier of the auxiliary PA.

Furthermore, the main driver amplifier is a differential structure formed by connection of two symmetrical cascode amplifiers.

The auxiliary driver amplifier is a differential structure formed by connection of two symmetrical cascode amplifiers.

Furthermore, each cascode amplifier of the main driver amplifier is formed by connection of two NMOS transistors.

Each cascode amplifier of the auxiliary driver amplifier is formed by connection of two NMOS transistors.

Furthermore, a gate bias voltage of the NMOS transistors, in common-gate connection, of the cascode amplifiers of the main driver amplifier is equal to that of the NMOS transistors, in common-gate connection, of the cascode amplifiers of the auxiliary driver amplifier.

A first inductor is connected between two differential outputs of the main driver amplifier, a second inductor is connected between two differential outputs of the auxiliary driver amplifier, a center tap of the first inductor is connected to a first power voltage, and a center tap of the second inductor is connected to a first power voltage.

Furthermore, two first resistors with identical resistances are connected between two differential inputs of the main PA, and a bias voltage used to make the two cascode amplifiers of the main PA work in class AB is applied to a joint of the two first resistors.

Two second resistors with identical resistances are connected between two differential inputs of the auxiliary PA, and a bias voltage used to make the two cascode amplifiers of the auxiliary PA work in class C is applied to a joint of the two second resistors.

Furthermore, gates of the NMOS transistors, in common-gate connection, of the two cascode amplifiers of the main PA are connected together and are connected to a corresponding bias voltage.

Gates of the NMOS transistors, in common-gate connection, of the two cascode amplifiers of the auxiliary PA are connected together and are connected to a corresponding bias voltage.

According to the transformer-based Doherty PA, the first linear network circuit is arranged at the input of the main PA or the second linear network circuit is arranged at the input of the auxiliary PA to compensate for the input capacitance of the input of the main PA or to compensate for the input capacitance of the input of the auxiliary PA, so that the variation of the input capacitance is reduced when the input signal varies, and thus, the linearity of the Doherty PA is improved.

BRIEF DESCRIPTION OF THE SEVERAL VIEWS OF THE DRAWINGS

The invention is further expounded below with reference to accompanying drawings and specific embodiments.

DETAILED DESCRIPTION OF THE INVENTION

Figure 5:
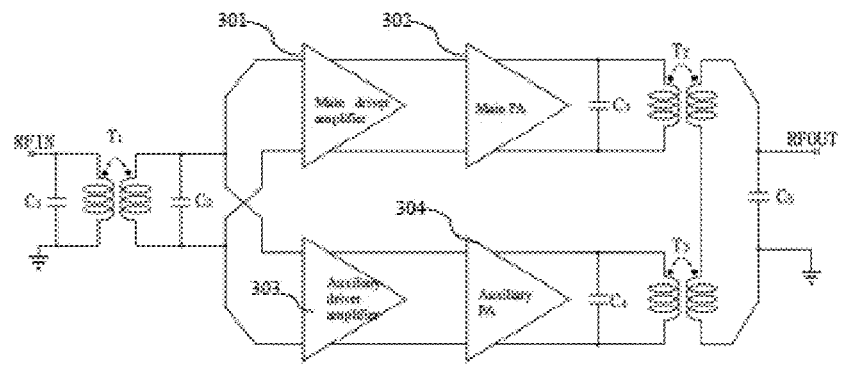
FIG. 5 is a structural view of an existing transformer-based Doherty PA.

Existing Transformer-Based Doherty PA:

FIG. 5 is a structural view of an existing transformer-based Doherty PA. As shown in FIG. 5, the existing transformer-based Doherty PA comprises a main PA path and an auxiliary PA path, wherein the main PA path and the auxiliary PA path are connected in parallel.

The main PA path comprises a main PA 302, and the auxiliary PA path comprises an auxiliary PA 304.

The main PA path further comprises a main driver amplifier 301, wherein an output of the main driver amplifier 301 is connected to an input of the main PA 302, a radio-frequency input signal RFIN is accessed to an input of the main driver amplifier 301, and an output of the main PA 302 outputs a radio-frequency output signal RFOUT.

The auxiliary PA path further comprises an auxiliary driver amplifier 303, wherein an output of the auxiliary driver amplifier 303 is connected to an input of the auxiliary PA 304, an input of the auxiliary driver amplifier 303 is connected to the radio-frequency input signal RFIN, and an output of the auxiliary PA 304 outputs the radio-frequency output signal RFOUT.

The main PA 302 works in class AB, and the auxiliary PA 304 works in class C.

The radio-frequency input signal RFIN is accessed to the input of the main driver amplifier 301 via a first transformer $T_1$. An input of the first transformer $T_1$ is connected to a capacitor $C_1$, and an output of the transformer $T_1$ is connected with a capacitor $C_2$.

The output of the main PA 302 outputs the radio-frequency output signal RFOUT via a second transformer $T_2$. An input of the second transformer $T_2$ is connected to a capacitor $C_3$.

The output of the auxiliary PA 304 outputs the radio-frequency signal RFOUT via a third transformer $T_3$. An input of the third transformer $T_3$ is connected to a capacitor $C_4$.

The output of the second transformer $T_2$ has two ports, and the output of the third transformer $T_3$ also has two ports. One port at the output of the second transformer $T_2$ is connected to one port at the output of the third transformer $T_3$. The other port at the output of the second transformer $T_2$ serves as an output port of the radio-frequency output signal RFOUT. The other port at the output of the third transformer $T_3$ is grounded. A capacitor $C_5$ is connected between the port, serving as the output port of the radio-frequency output signal RFOUT, at the output of the second transformer $T_2$ and the grounded port at the output of the third transformer $T_3$.

Figure 1:
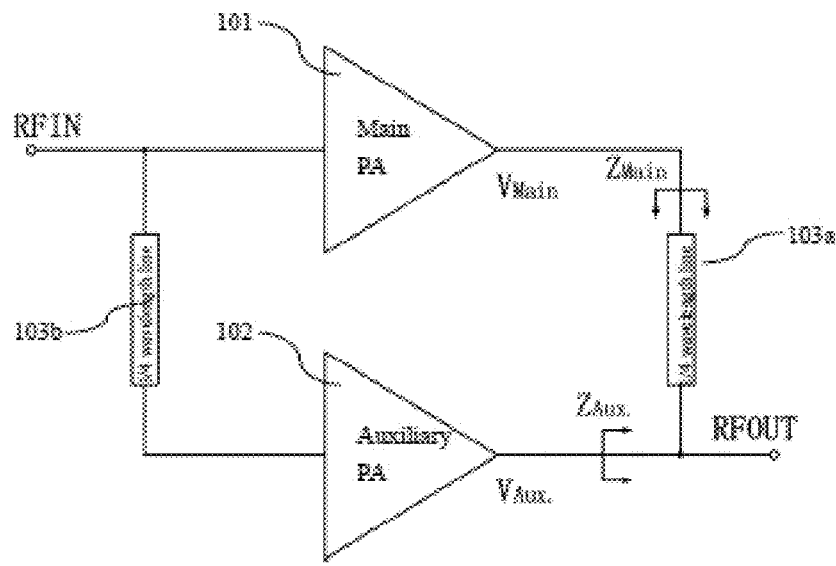
FIG. 1 is a structural view of an existing Doherty PA.
Figure 2:
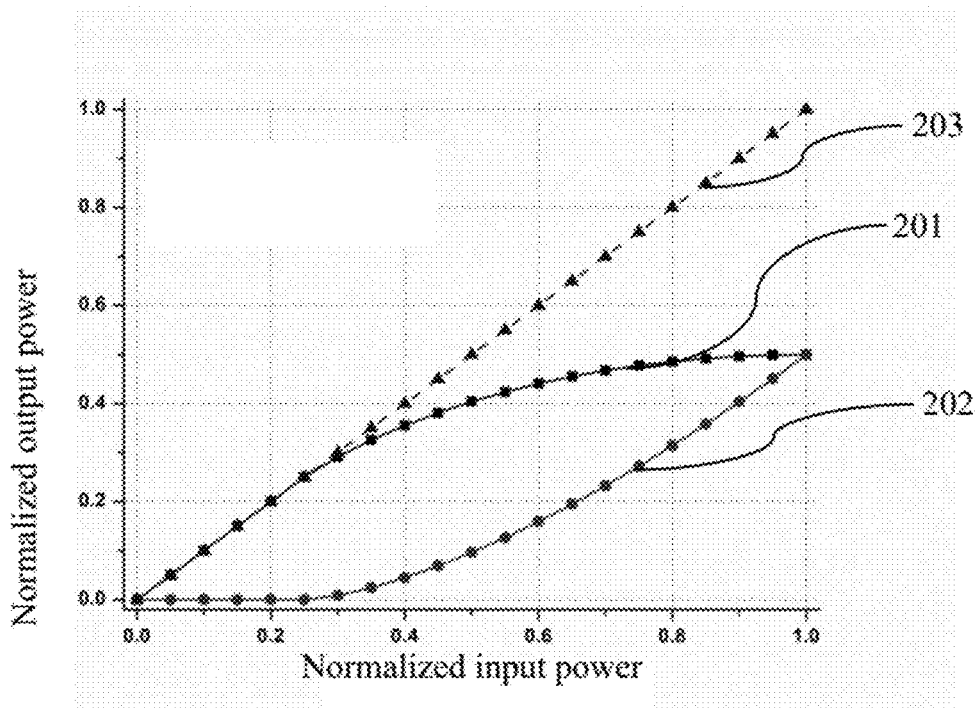
FIG. 2 shows input power and output power curves of the structure in FIG. 1.
Figure 3:
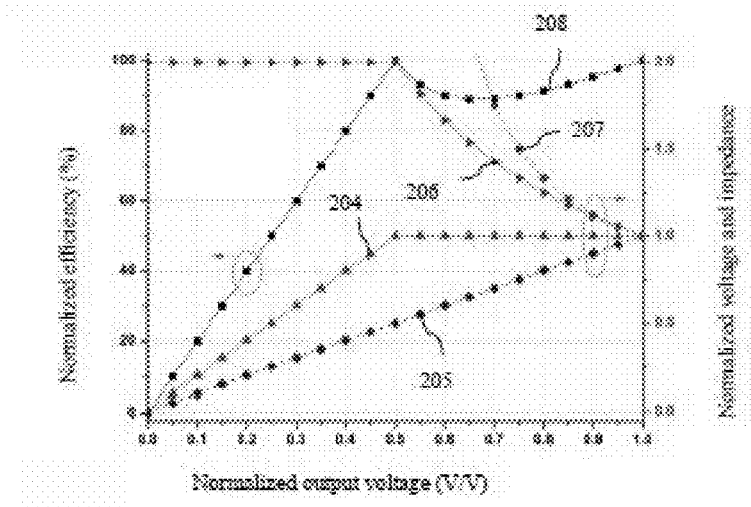
FIG. 3 shows voltage and impedance curves of a main PA and an auxiliary PA of the structure in FIG. 1 as well as an efficiency curve of the whole Doherty PA.
Figure 4:
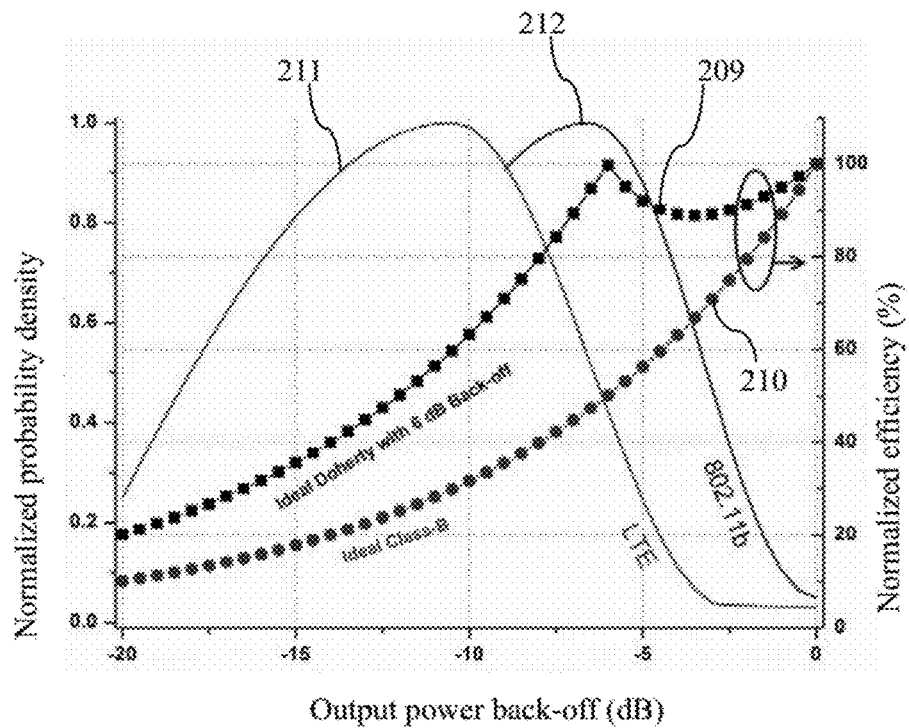
FIG. 4 shows comparison curves of the existing Doherty PA capable of improving the efficiency in the power back-off region.

The existing transformer-based Doherty PA shown in FIG. 5 is a novel structure coming into being in recent years, and the working mode of this transformer-based Doherty PA is similar to that of the classic Doherty PA shown in FIG. 1. In spite of the high efficiency in the 6 dB power back-off region, this transformer-based Doherty PA has a poor linearity in the saturated output power region and the power back-off region and thus needs to be optimized.

Figure 6:
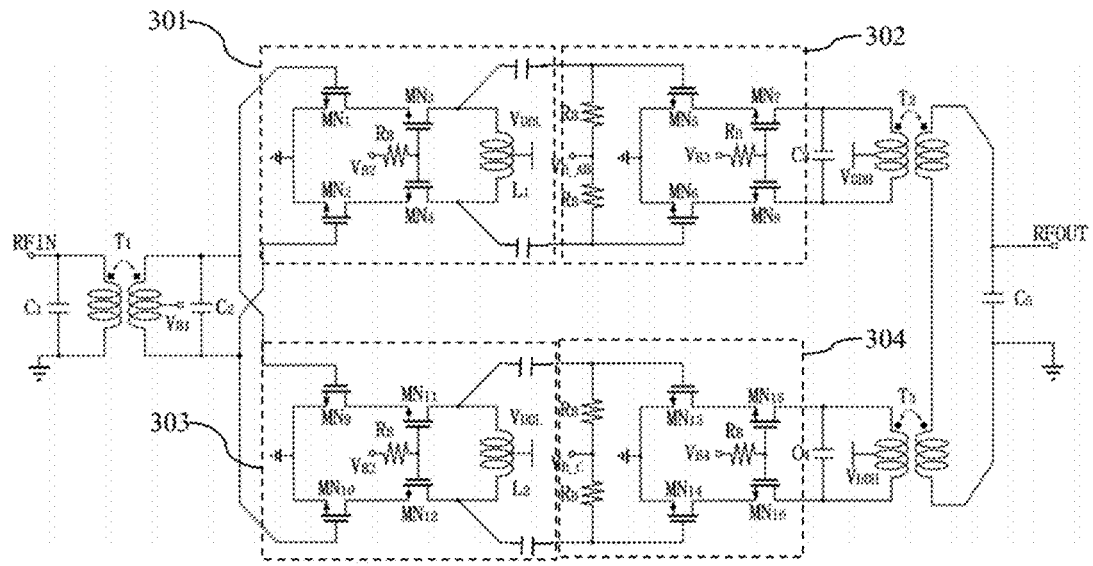
FIG. 6 is a circuit diagram of one specific implementation of the structure in FIG. 5.

FIG. 6 shows a circuit diagram of one specific implementation of the structure in FIG. 5. As shown in FIG. 6:

The main PA 302 is a cascode amplifier formed by connection of two NMOS transistors.

The auxiliary PA 304 is a cascode amplifier formed by connection of two NMOS transistors.

The radio-frequency input signal RFIN is a differential signal. The main PA 302 is a differential structure formed by connection of two symmetrical cascode amplifiers. The two cascode amplifiers respectively correspond to a structure formed by connection of NMOS transistors $MN_5$ and $MN_7$ and a structure formed by connection of NMOS transistors $MN_6$ and $MN_8$.

The auxiliary PA 304 is a differential structure formed by connection of two symmetrical cascode amplifiers. The two cascode amplifiers respectively correspond to a structure formed by connection of NMOS transistors $MN_{13}$ and $MN_{15}$ and a structure formed by connection of NMOS transistors $MN_{14}$ and $MN_{16}$.

The main driver amplifier 301 is a differential structure formed by connection of two symmetrical cascode amplifiers.

The auxiliary driver amplifier 303 is a differential structure formed by connection of two symmetrical cascode amplifiers.

Each cascode amplifier of the main driver amplifier 301 is formed by connection of two NMOS transistors. The two cascode amplifiers of the main driver amplifier 301 respectively correspond to a structure formed by connection of NMOS transistors $MN_1$ and $MN_3$ and a structure formed by connection of NMOS transistors $MN_2$ and $MN_4$.

Each cascode amplifier of the auxiliary driver amplifier 303 is formed by connection of two NMOS transistors. The two cascode amplifiers of the auxiliary driver amplifier 303 respectively correspond to a structure formed by connection of NMOS transistors $MN_9$ and $MN_{11}$ and a structure formed by connection of NMOS transistors $MN_{10}$ and $MN_{12}$.

The gate bias voltage $V_{B2}$ of the NMOS transistors $MN_3$ and $MN_4$, in common-gate connection, of the cascode amplifiers of the main driver amplifier 301 is equal to that of the NMOS transistors $MN_{11}$ and $MN_{12}$, in common-gate connection, of the cascode amplifiers of the auxiliary driver amplifier 303. The gate bias voltage $V_{B2}$ is connected to gates of the NMOS transistors $MN_3$ and $MN_4$ through a corresponding resistor $R_B$ and is connected to gates of the NMOS transistors $MN_{11}$ and $MN_{12}$ through a corresponding resistor $R_B$.

A first inductor $L_1$ is connected between two differential outputs of the main driver amplifier 301, a second inductor $L_2$ is connected between two differential outputs of the auxiliary driver amplifier 303, a center tap of the first inductor $L_1$ is connected to a first power voltage $V_{DDL}$, and a center tap of the second inductor L2 is connected to a first power voltage $V_{DDL}$.

Two first resistors $R_B$ with identical resistances are connected between two different inputs of the main PA 302 in series, and a bias voltage $V_{B\_AB}$ used to make the two cascode amplifiers of the main PA 302 work in class AB is applied to a joint of the two first resistors $R_B$.

Two second resistors $R_B$ with identical resistances are connected between two differential inputs of the auxiliary PA 304 in series, and a bias voltage $V_{B\_C}$ used to make the two cascode amplifiers of the auxiliary PA 304 work in class C is applied to a joint of the two second resistors $R_B$.

Gates of the NMOS transistors $MN_7$ and $MN_8$, in common-gate connection, of the two cascode amplifiers of the main PA 302 are connected, and a corresponding bias voltage $V_{B3}$ is connected to the gates of the NMOS transistors $MN_7$ and $MN_8$ via a corresponding resistor $R_B$.

Gates of the NMOS transistors $MN_{15}$ and $MN_{16}$, in common-gate connection, of the two cascode amplifiers of the auxiliary PA 304 are connected, and a corresponding bias voltage $V_{B4}$ is connected to the gates of the NMOS transistors $MN_{15}$ and $MN_{16}$ via a corresponding resistor $R_B$.

A center tap of an output coil of the first transformer $T_1$ is connected to a bias voltage $V_{B1}$, a center tap of an input coil of the second transformer $T_2$ is connected to a second power voltage $V_{DDH}$, and a center tap of an input coil of the third transformer $T_3$ is connected to a second power voltage $V_{DDH}$.

All resistors are represented by $R_B$ in FIG. 6. However, in practical use, resistance values of the resistors can be correspondingly set as needed.

Figure 7:
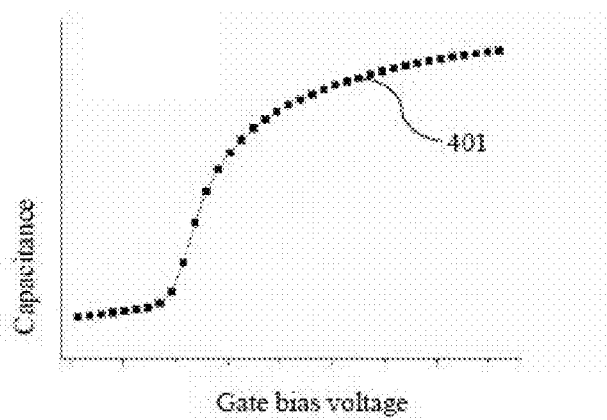
FIG. 7 shows a parasitic capacitance curve of the inputs of a main PA and an auxiliary PA of the circuit structure in FIG. 6.

FIG. 7 shows a parasitic capacitance curve of the inputs of the main PA and the auxiliary PA of the circuit structure in FIG. 6. In FIG. 7, the X-axis refers to gate bias voltage, and the Y-axis refers to capacitance. As for the main PA 302 in FIG. 6, the input of the main PA 302 corresponds to gates of the NMOS transistors $MN_5$ and $MN_6$, the gate bias voltage of the main PA 302 corresponds to the bias voltage of the gates of the NMOS transistors $MN_5$ and $MN_6$, and the gate parasitic capacitance of the main PA 302 corresponds to the parasitic capacitance CggN of the gates of the NMOS transistors $MN_5$ and $MN_6$. Similarly, as for the auxiliary PA 304 in FIG. 6, the gate bias voltage of the auxiliary PA 304 corresponds to the bias voltage of gates of the NMOS transistors $MN_{13}$ and $MN_{14}$, and the gate parasitic capacitance of the auxiliary PA 304 corresponds to the parasitic capacitance of the gates of the NMOS transistors $MN_{13}$ and $MN_{14}$. In FIG. 7, curve 401 shows CggN variations of one NMOS transistor, and as can be seen from curve 401, CggN varies along with the variation of the gate bias voltage, and then an input capacitance varies along with the corresponding gate bias voltage. The variation of the input parasitic capacitance is the main factor causing AM-PM distortion, which in turn will directly lead to linearity deterioration.

Figure 8:
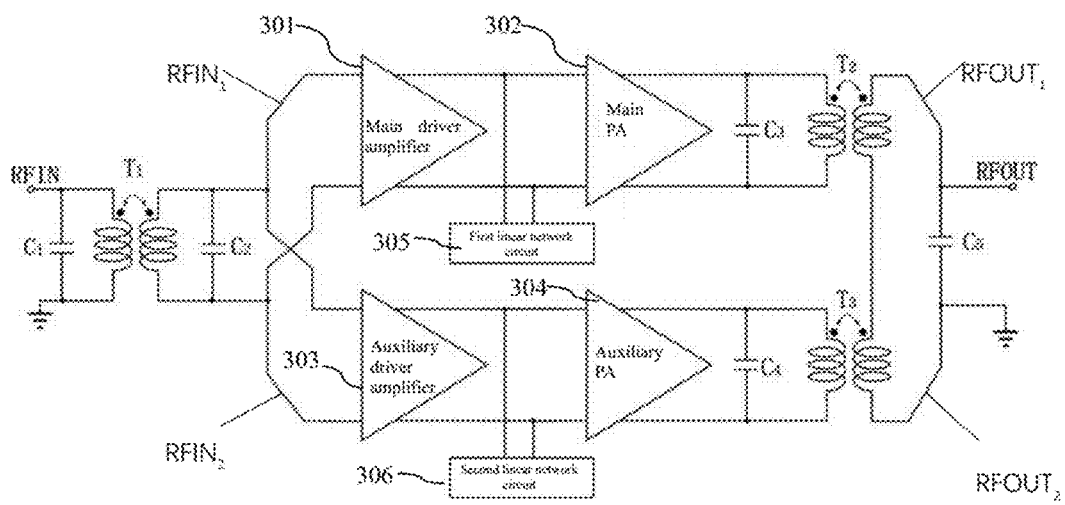
FIG. 8 is a structural view of a transformer-based Doherty PA in an embodiment of the invention.

Transformer-Based Doherty PA in One Embodiment of the Invention:

FIG. 8 is a structural view of a transformer-based Doherty PA in one embodiment of the invention. As shown in FIG. 8, the transformer-based Doherty PA in this embodiment comprises a main PA path and an auxiliary PA path, wherein the main PA path and the auxiliary PA path are connected in parallel.

The main PA path comprises a main PA 302, and the auxiliary PA path comprises an auxiliary PA 304.

The Doherty PA further comprises a first linear network circuit 305 or a second linear network circuit 306.

The first linear network circuit 305 is arranged at an input of the main PA 302 and is used to compensate for variations of an input capacitance of the main PA 302, so as to improve the linearity of the main PA 302 and accordingly improve the linearity of the Doherty PA.

The second linear network circuit 306 is arranged at an input of the auxiliary PA 304 and is used to compensate for variations of an input capacitance of the auxiliary PA 304, so as to improve the linearity of the auxiliary PA 304 and accordingly improve the linearity of the Doherty PA.

Either the first linear network circuit 305 or the second linear network circuit 306 can improve the linearity of the Doherty PA. Preferably, both the first linear network circuit 305 and the second linear network circuit 306 are configured, so that the linearity of the Doherty PA is optimized.

The main PA path further comprises a main driver amplifier 301, wherein an output of the main driver amplifier 301 is connected to the input of the main PA 302, a first part of a radio-frequency input signal $RFIN_1$ is accessed to an input of the main driver amplifier 301, and an output of the main PA 302 outputs a first part of a radio-frequency output signal $RFOUT_1$.

The auxiliary PA path further comprises an auxiliary driver amplifier 303, wherein an output of the auxiliary driver amplifier 303 is connected to the input of the auxiliary PA 304, an input of the auxiliary driver amplifier 303 is connected to a second part of a radio-frequency input signal $RFIN_2$, and an output of the auxiliary PA 304 outputs a second part of a radio-frequency output signal $RFOUT_2$.

The main PA 302 works in class AB, and the auxiliary PA 304 works in class C.

The radio-frequency input signal RFIN is accessed to the input of the main driver amplifier 301 via a first transformer $T_1$. An input of the first transformer $T_1$ is connected to a capacitor $C_1$, and an output of the first transformer $T_1$ is connected to a capacitor $C_2$.

The output of the main PA 302 outputs the radio-frequency output signal RFOUT via a second transformer $T_2$. An input of the second transformer $T_2$ is connected to a capacitor $C_3$.

The output of the auxiliary PA 304 outputs the radio-frequency output signal RFOUT via a third transformer $T_3$. An input of the third transformer $T_3$ is connected to a capacitor $C_4$.

An output of the second transformer $T_2$ has two ports, and an output of the third transformer $T_3$ also has two ports. One port at the output of the second transformer $T_2$ is connected to one port at the output of the third transformer $T_3$. The other port at the output of the second transformer $T_2$ serves as an output port of the radio-frequency output signal RFOUT. The other port at the output of the third transformer $T_3$ is grounded. A capacitor $C_5$ is connected between the port, serving as the output port of the radio-frequency output signal RFOUT, at the output of the second transformer $T_2$ and the grounded port at the output of the third transformer $T_3$.

In this embodiment, the first linear network circuit 305 is arranged at the input of the main PA 302 or the second linear network circuit 306 is arranged at the input of the auxiliary PA 304 to compensate for the input capacitance of the input of the main PA 302 or to compensate for the input capacitance of the input of the auxiliary PA 304, so that the variation of the input capacitance is reduced when the input signal varies, that is to say, the input capacitance is kept stable, so that AM-PM distortion is reduced, and the linearity of the Doherty PA is improved.

Figure 9:
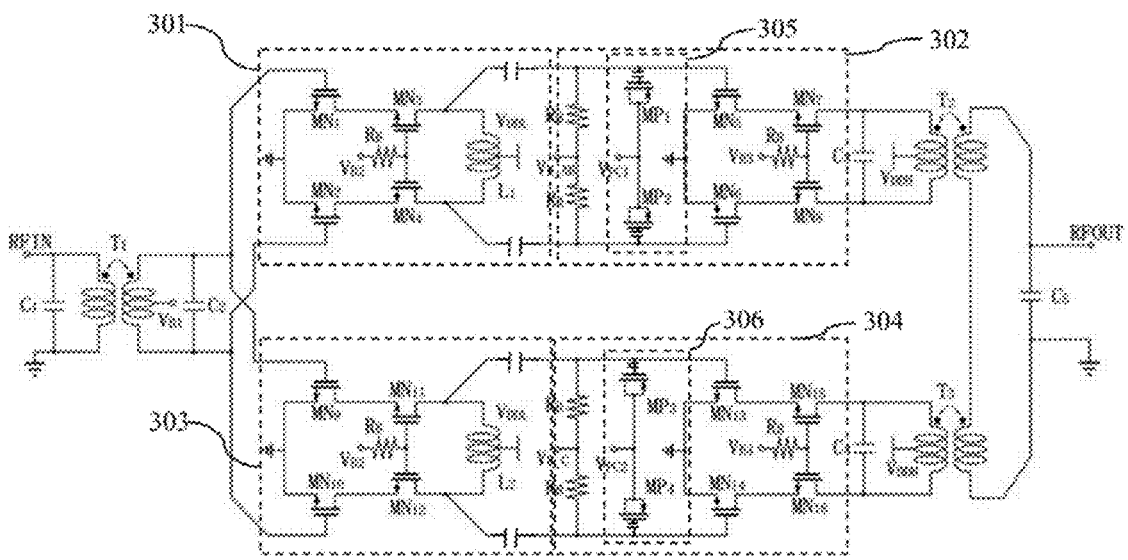
FIG. 9 is a structural view of a transformer-based Doherty PA in a preferred embodiment of the invention.

Transformer-Based Doherty PA in a Preferred Embodiment of the Invention:

FIG. 9 is a structural view of a transformer-based Doherty PA in a preferred embodiment of the invention. The structure in FIG. 9 is obtained by further improvement on the structure in FIG. 8. In this preferred embodiment of the invention:

The main PA 302 is a cascode amplifier formed by connection of two NMOS transistors. The first linear network circuit 305 is formed by PMOS transistors connected via a capacitor. The gate capacitance of the NMOS transistors at the input of the main PA 302 and the gate capacitance of the PMOS transistors of the first linear network circuit 305 are mutually compensated to stabilize the input capacitance of the main PA 302.

The auxiliary PA 304 is a cascode amplifier formed by connection of two NMOS transistors. The second linear network circuit 306 is formed by PMOS transistors connected via a capacitor. The gate capacitance of the NMOS transistors at the input of the auxiliary PA 304 and the gate capacitance of the PMOS transistors of the second linear network circuit 306 are mutually compensated to stabilize the input capacitance of the auxiliary PA 304.

The radio-frequency input signal RFIN is a differential signal. The main PA 302 is a differential structure formed by connection of two symmetrical cascode amplifiers. The two cascode amplifiers of the main PA 302 respectively correspond to a structure formed by connection of NMOS transistors $MN_5$ and $MN_7$ and a structure formed by connection of NMOS transistors $MN_6$ and $MN_8$. The first linear network circuit 305 comprises two PMOS transistors $MP_1$ and $MP_2$. Each PMOS transistor of the first linear network circuit 305 corresponds to the NMOS transistor at an input of one cascode amplifier of the main PA 302. Particularly, the PMOS transistor $MP_1$ corresponds to the NMOS transistor $MN_5$, and the PMOS transistor $MP_2$ corresponds to the NMOS transistor $MN_6$. A gate of the PMOS transistor $MP_1$ is connected to a gate of the NMOS transistor $MN_5$. A gate of the PMOS transistor $MP_2$ is connected to a gate of the NMOS transistor $MN_6$. A source and drain of the PMOS transistor $MP_1$ as well as a source and drain of the PMOS transistor $MP_2$ are connected to a voltage $V_{PC1}$.

The auxiliary PA 304 is a differential structure formed by connection of two symmetrical cascode amplifiers. The two cascode amplifiers of the auxiliary PA 304 respectively correspond to a structure formed by connection of NMOS transistors $MN_{13}$ and $MN_{15}$ and a structure formed by connection of NMOS transistors $NM_{14}$ and $MN_{16}$. The second linear network circuit 306 comprises two PMOS transistors $MP_3$ and $MP_4$. Each PMOS transistor of the second linear network circuit 306 corresponds to the NMOS transistor at an input of one cascode amplifier of the auxiliary PA 304. Particularly, the PMOS transistor $MP_3$ corresponds to the NMOS transistor $MN_{13}$, and the PMOS transistor $MP_4$ corresponds to the NMOS transistor $MN_{14}$. A gate of the PMOS transistor $MP_3$ is connected to a gate of the NMOS transistor $MN_{13}$. A gate of the PMOS transistor $MP_4$ is connected to a gate of the NMOS transistor $MN_{14}$. A source and drain of the PMOS transistor $MP_3$ as well as a source and drain of the PMOS transistor $MP_4$ are connected to a voltage $V_{PC2}$.

The main driver amplifier 301 is a differential structure formed by connection of two symmetrical cascode amplifiers.

The auxiliary driver amplifier 303 is a differential structure formed by connection of two symmetrical cascode amplifiers.

Each cascode amplifier of the main driver amplifier 301 is formed by connection of two NMOS transistors. The two cascode amplifiers of the main driver amplifier 301 respectively correspond to a structure formed by connection of NMOS transistors $MN_1$ and $MN_3$ and a structure formed by connection of NMOS transistors $MN_2$ and $MN_4$.

Each cascode amplifier of the auxiliary driver amplifier 303 is formed by connection of two NMOS transistors. The two cascode amplifiers of the auxiliary driver amplifier 303 respectively correspond to a structure formed by connection of NMOS transistors $MN_9$ and $MN_{11}$ and a structure formed by connection of NMOS transistors $MN_{10}$ and $MN_{12}$.

The gate bias voltage $V_{B2}$ of the NMOS transistors $MN_3$ and $MN_4$, in common-gate connection, of the cascode amplifiers of the main driver amplifier 301 is equal to that of the NMOS transistors $MN_{11}$ and $MN_{12}$, in common-gate connection, of the cascode amplifiers of the auxiliary driver amplifier 303. The gate bias voltage $V_{B2}$ is connected to gates of the NMOS transistors $MN_3$ and $MN_4$ via a corresponding resistor $R_B$ and is connected to gates of the NMOS transistors $MN_{11}$ and $MN_{12}$ via a corresponding resistor $R_B$.

A first inductor $L_1$ is connected between two differential outputs of the main driver amplifier 301. A second inductor $L_2$ is connected between two differential outputs of the auxiliary driver amplifier 303. A center tap of the first inductor $L_1$ is connected to a first power voltage $V_{DDL}$. A center tap of the second inductor $L_2$ is connected to a first power voltage $V_{DDL}$.

Two first resistors $R_B$ with identical resistances are connected between two differential inputs of the main PA 302 in series, and a bias voltage $V_{B\_AB}$ used to make the two cascode amplifiers of the main PA 302 work in class AB is applied to a joint of the two first resistors $R_B$.

Two second resistors $R_B$ with identical resistances are connected between two differential inputs of the auxiliary PA 304 in series, and a bias voltage $V_{B\_C}$ used to make the two cascode amplifiers of the auxiliary PA 304 work in class C is applied to a joint of the two second resistors $R_B$.

Gates of the NMOS transistors $MN_7$ and $MN_8$, in common-gate connection, of the two cascode amplifiers of the main PA 302 are connected, and a corresponding bias voltage $V_{B3}$ is connected to the gates of the NMOS transistors $MN_7$ and $MN_8$ via a corresponding resistor $R_B$.

Gates of the NMOS transistors $MN_{15}$ and $MN_{16}$, in common-gate connection, of the two cascode amplifiers of the auxiliary PA 304 are connected, and a corresponding bias voltage $V_{B4}$ is connected to the gates of the NMOS transistors $MN_{15}$ and $MN_{16}$ via a corresponding resistor $R_B$.

A center tap of an output coil of the first transformer $T_1$ is connected to a bias voltage $V_{B1}$. A center tap of an input coil of the second transformer $T_2$ is connected to a second power voltage $V_{DDH}$. A center tap of an input coil of the third transformer $T_3$ is connected to a second power voltage $V_{DDH}$.

All resistors are represented by $R_B$ in FIG. 9. In practical use, resistance values of the resistors can be correspondingly set as needed.

FIG. 8 is obtained by further improvement on FIG. 5, and in FIG. 5 and FIG. 8, identical components are represented by identical reference signs. FIG. 9 is obtained by further improvement on FIG. 6, and in FIG. 6 and FIG. 9, identical components are represented by identical reference signs.

Figure 10:
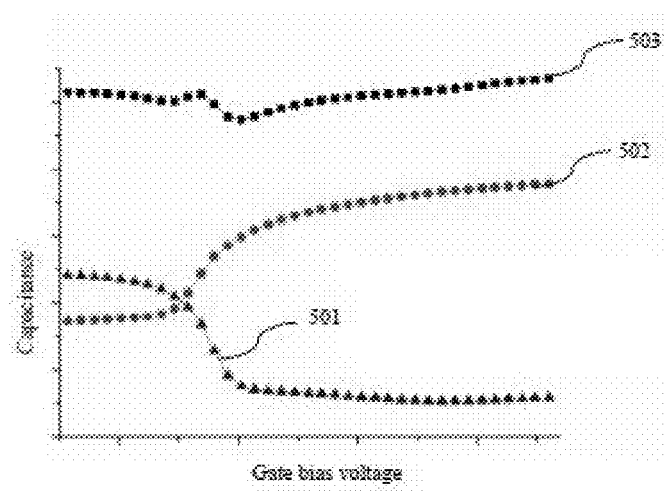
FIG. 10 shows parasitic capacitance curves of the inputs of a main PA and an auxiliary PA of the circuit in the preferred embodiment of the invention in FIG. 9.

FIG. 10 shows parasitic capacitance curves of the inputs of the main PA and the auxiliary PA of the circuit in the preferred embodiment of the invention shown in FIG. 9. In FIG. 10, the X-axis refers to gate bias voltage, and the Y-axis refers to capacitance. Similar to curve 401 in FIG. 6, curve 502 is about CggN variations of one NMOS transistor. Curve 501 is a variation curve of the gate parasitic capacitance CggP of one of the PMOS transistors $MP_1$, $MP_2$, $MP_3$ and $MP_4$. Curve 503 is formed by superposition of curve 501 and curve 502, namely curve 503 is a variation curve of the overall input capacitance obtained by superposition of CggP and CggN. As can be seen from FIG. 10, the variation of CggP and the variation of CggN are compensated by each other. Curve 503 is kept stable, and the overall input capacitance will not drastically fluctuate when the gate bias voltage varies. Therefore, the transformer-based Doherty PA in this preferred embodiment of the invention can reduce AM-PM distortion, thus, improving the linearity of circuits.

Figure 11:
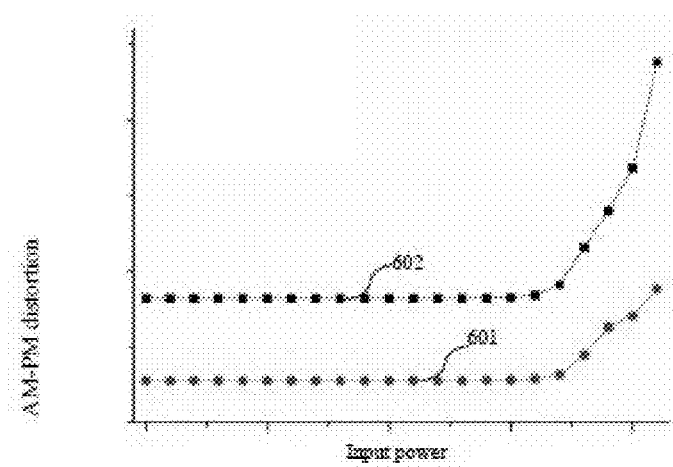
FIG. 11 is a comparison diagram of amplitude modulation-phase modulation (AM-PM) distortion curves of the existing circuit structure in FIG. 6 and the circuit structure of the preferred embodiment of the invention in FIG. 9.

FIG. 11 is a comparison diagram of AM-PM distortion curves of the existing circuit structure in FIG. 6 and the circuit structure of the preferred embodiment of the invention in FIG. 9, wherein curve 601 is an AM-PM distortion curve of the circuit structure in this preferred embodiment of the invention, and curve 602 is an AM-PM distortion curve of the existing circuit structure. As can be seen from FIG. 11, the transformer-based Doherty PA in this preferred embodiment of the invention can reduce AM-PM distortion.

The invention is detailed above with reference to specific embodiments, but these specific embodiments are not intended to limit the invention. Various transformations and improvements can be made by those skilled in this field without deviating from the principle of the invention, and all these transformations and improvements should also fall within the protection scope of the invention.

What is claimed is:

1. A transformer-based Doherty power amplifier comprising a main power amplifier path and an auxiliary power amplifier path, wherein the main power amplifier path and the auxiliary power amplifier path are connected in parallel;

the main power amplifier path comprises a main power amplifier, and the auxiliary power amplifier path comprises an auxiliary power amplifier;

the Doherty power amplifier further comprises a first linear network circuit or a second linear network circuit;

the first linear network circuit is arranged at an input of the main power amplifier and is used to compensate for variations of an input capacitance of the main power amplifier, so as to improve a linearity of the main power amplifier and accordingly improve a linearity of the Doherty power amplifier; and the second linear network circuit is arranged at an input of the auxiliary power amplifier and is used to compensate for variations of an input capacitance of the auxiliary power amplifier, so as to improve a linearity of the auxiliary power amplifier and accordingly improve the linearity of the Doherty power amplifier;

the main power amplifier works in class AB, and the auxiliary power amplifier works in class C and the radio-frequency input signal is a differential signal;

wherein the main power amplifier is a differential structure formed by connection of two symmetrical cascode amplifiers, each of the two symmetrical cascode amplifiers is formed by connection of two NMOS transistors, the first linear network circuit is formed by a PMOS transistor connected via a capacitor to the gate of one of the two NMOS transistors, and a gate capacitance of the NMOS transistors at the input of the main power amplifier and a gate capacitance of the PMOS transistors of the first linear network circuit are mutually compensated to stabilize the input capacitance of the main power amplifier;

and two first resistors with identical resistances are connected between two differential inputs of the main power amplifier, and a bias voltage applied to a common node of the two first resistors biases the main power amplifier in class AB.

2. The transformer-based Doherty power amplifier according to claim 1, wherein the main power amplifier path further comprises a main driver amplifier, an output of the main driver amplifier is connected to the input of the main power amplifier, a first part of the radio-frequency input signal is accessed to an input of the main driver amplifier, and an output of the main power amplifier outputs a first part of a radio-frequency output signal.

3. The transformer-based Doherty power amplifier according to claim 2, wherein the auxiliary power amplifier path further comprises an auxiliary driver amplifier, an output of the auxiliary driver amplifier is connected to the input of the auxiliary power amplifier, a second part of the radio-frequency input signal is accessed to an input of the auxiliary driver amplifier, and an output of the auxiliary power amplifier outputs a second part of the radio-frequency output signal.

4. The transformer-based Doherty power amplifier according to claim 3, wherein the radio-frequency input signal is accessed to the input of the main driver amplifier via a first transformer.

5. The transformer-based Doherty power amplifier according to claim 4, wherein the output of the main power amplifier outputs the first part of the radio-frequency output signal via a second transformer.

6. The transformer-based Doherty power amplifier according to claim 4, wherein the output of the auxiliary power amplifier outputs the second part of the radio-frequency output signal via a third transformer.

7. The transformer-based Doherty power amplifier according to claim 1, wherein the auxiliary power amplifier is a differential structure formed by connection of two symmetrical cascode amplifiers, each cascode amplifier is formed by connection of two NMOS transistors.

8. The transformer-based Doherty power amplifier according to claim 7, the second linear network circuit is formed by one PMOS transistor to each of the two cascode amplifiers connected via a capacitor, and a gate capacitance of the NMOS transistors at the input of the auxiliary power amplifier and a gate capacitance of the PMOS transistors of the second linear network circuit are mutually compensated to stabilize the input capacitance of the auxiliary power amplifier.

9. The transformer-based Doherty power amplifier according to claim 7, wherein gates of the NMOS transistors, in common-gate connection, of the two cascode amplifiers of the main power amplifier are connected together and are connected to a corresponding bias voltage; and gates of the NMOS transistors, in common-gate connection, of the two cascode amplifiers of the auxiliary power amplifier are connected together and are connected to a corresponding bias voltage.

10. The transformer-based Doherty power amplifier according to claim 9, wherein a gate bias voltage of the NMOS transistors, in common-gate connection, of the cascode amplifiers of the main driver amplifier is equal to that of the NMOS transistors, in common-gate connection, of the cascade amplifiers of the auxiliary driver amplifier; and a first inductor is connected between two differential outputs of the main driver amplifier, a second inductor is connected between two differential outputs of the auxiliary driver amplifier, a center tap of the first inductor is connected to a first power voltage, and a center tap of the second inductor is connected to a second power voltage.

11. The transformer-based Doherty power amplifier according to claim 7, two second resistors with identical resistances are connected between two differential inputs of the auxiliary power amplifier, and a bias voltage applied to a common node of two second resistors biases the auxiliary power amplifier in class C.

* * * * *